United States Patent
Mazz et al.

(10) Patent No.: US 7,227,294 B2
(45) Date of Patent: Jun. 5, 2007

(54) PIEZOELECTRIC MOTOR DRIVE CIRCUIT AND METHOD

(75) Inventors: Thomas Mazz, Huntington, NY (US);
Dmitriy Yavid, Stony Brook, NY (US);
Frederick F. Wood, Medford, NY (US)

(73) Assignee: Symbol Technologies, Inc., Holtsville, NY (US)

(*) Notice: Subject to any disclaimer, the term of this patent is extended or adjusted under 35 U.S.C. 154(b) by 0 days.

(21) Appl. No.: 11/119,060

(22) Filed: Apr. 29, 2005

(65) Prior Publication Data

US 2006/0244339 A1    Nov. 2, 2006

(51) Int. Cl.
*H01L 41/09* (2006.01)

(52) U.S. Cl. .................... 310/317; 310/316.01
(58) Field of Classification Search .......... 310/317, 310/316.01, 318; 362/341
See application file for complete search history.

(56) References Cited

U.S. PATENT DOCUMENTS

| 5,534,970 | A  | * | 7/1996 | Nakashima et al. | .......... 355/53 |
| 2002/0125324 | A1 | * | 9/2002 | Yavid et al. | .......... 235/462.45 |
| 2004/0004775 | A1 | * | 1/2004 | Turner et al. | .......... 359/877 |
| 2004/0007941 | A1 | * | 1/2004 | Yuasa et al. | .......... 310/314 |
| 2005/0002087 | A1 | * | 1/2005 | Knowles et al. | .......... 359/291 |

* cited by examiner

*Primary Examiner*—Darren Schuberg
*Assistant Examiner*—Derek Rosenau
(74) *Attorney, Agent, or Firm*—Kirschstein, et al.

(57) ABSTRACT

A piezoelectric transducer is driven to mechanically oscillate a mirror at a mechanical resonant frequency with high precision despite frequency variations introduced by temperature, tolerances and ageing of components. Switches are actuated at different times in order to make the drive frequency correspond to the mechanical resonant frequency.

14 Claims, 8 Drawing Sheets

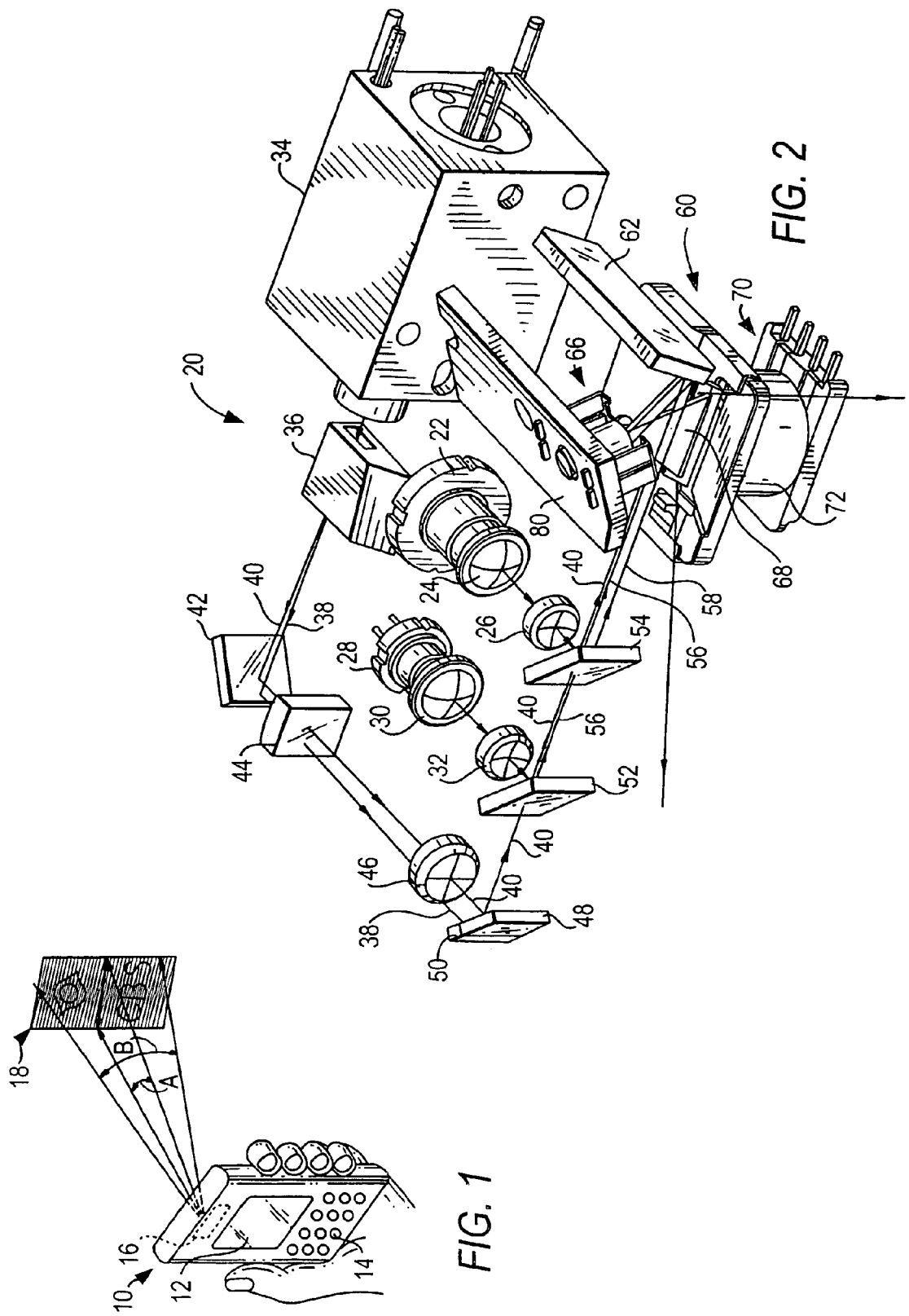

PIEZOELECTRIC MOTOR DRIVE CIRCUIT AND METHOD

BACKGROUND OF THE INVENTION

1. Field of the Invention

The present invention generally relates to an arrangement for and a method of driving a piezoelectric motor to oscillate a mirror, especially for use in a color image projection system operative for projecting a two-dimensional image in color while maintaining low power consumption, high resolution, miniature compact size, quiet operation and minimal vibration.

2. Description of the Related Art

It is generally known to project a two-dimensional image on a screen based on a pair of scan mirrors which oscillate in mutually orthogonal directions to scan a laser beam over a raster pattern. However, the known image projection systems project the image with limited resolution, typically less than a fourth of video-graphics-array (VGA) quality of 640×480 pixels, and not in true color.

It is also known to oscillate one of the scan mirrors by inertial forces, such as taught by U.S. patent application Ser. No. 10/975,888, filed Oct. 27, 2004, and U.S. patent application Ser. No. 10/387,878, filed Mar. 13, 2003, both assigned to the assignee of the instant application and both incorporated herein by reference, by connecting a piezoelectric motor comprising a pair of piezoelectric transducers to a frame at opposite sides of a hinge about which the scan mirror is free to oscillate. A periodic drive signal is applied to both transducers to cause one transducer to extend and push against one side of the frame, while the other transducer is simultaneously caused to contract and pull against the opposite side of the frame, and vice versa. The push-pull forces are alternately transmitted through the frame to cause the scan mirror to oscillate about the hinge at a mechanical resonance frequency. A light beam incident on the mirror is swept as one or more scan lines in space.

A drive circuit for generating the periodic drive signal typically requires a relatively high AC voltage, e.g., 50 volts peak-to-peak, with a drive or fundamental frequency precisely tuned to the mechanical resonance frequency of the motor. One known drive circuit uses a high DC voltage, e.g., 50 volts, and then passes this voltage through a linear control. However, this drive circuit incurs relatively high power losses and is inefficient.

Other known drive circuits involve using energy recycling. For example, the piezoelectric transducer has an inherent capacitance, and an inductor having an inductance is connected to the transducer to form a resonant circuit. A low DC drive voltage, e.g., 5 volts, is switched at the electrical resonance frequency created by the resonant circuit and is used to create a voltage boost to the drive voltage on the order of 50 volts AC. The drive frequency must therefore match the electrical resonance frequency in order to achieve drive voltage boosts on the order of ten times.

Experience has shown, however, that such energy recycling drive circuits are unsatisfactory in practice. The capacitance of the piezoelectric transducer varies from unit to unit, and also with temperature and with age. The inductance of the inductor also varies from unit to unit, and also with temperature and with age. By way of example, for a temperature variation of 40° C., the capacitance can change by 20%; the inductance can change by 5%; and the electrical resonant frequency can change by 12%.

To counter such undesired variation in the electrical resonant frequency, the prior art has proposed sophisticated, complex compensation circuitry to compensate for such capacitance and inductance changes. This compensation circuitry uses additional capacitors, additional inductors, switches and logical controls, all of which add both cost and size to the overall arrangement, as well as additional components whose impedances are also dependent on tolerances, temperature and ageing.

Still other known drive circuits use manual adjustments to tune the electrical resonant frequency. Typically, a mechanically tunable inductor is adjusted. However, this drive circuit is unsatisfactory since a single manual adjustment cannot adequately compensate over a whole range of tolerance, temperature and ageing variations.

SUMMARY OF THE INVENTION

Objects of the Invention

Accordingly, it is a general object of this invention to provide an arrangement for, and a method of, electrically driving a piezoelectric motor, especially for use in oscillating a mirror in an image projection arrangement that projects a sharp and clear, two-dimensional color image over an extended range of distances away from the arrangement.

Another object of this invention is to drive the piezoelectric motor so as to compensate for temperature, tolerance and ageing variations.

Still another object of this invention is to decouple the electrical resonance frequency from the mechanical resonance frequency, thereby permitting the electrical resonance frequency to vary over a wide tolerance range.

Yet another object of this invention is to eliminate the prior art requirement of utilizing additional impedances to adjust for variations in temperature, tolerances and ageing.

An additional object is to provide a miniature, compact, lightweight, and inexpensive drive circuit for driving a piezoelectric motor in a portable color image projection arrangement useful in many instruments of different form factors.

FEATURES OF THE INVENTION

In keeping with these objects and others which will become apparent hereinafter, one feature of this invention resides, briefly stated, in an arrangement for, and a method of, electrically driving a piezoelectric transducer to mechanically oscillate a mirror at a mechanical resonant frequency. In a preferred embodiment, the mirror is one of a pair of scan mirrors operative for sweeping a laser beam along generally mutually orthogonal directions, preferably at different scan rates and at different scan angles, to project the beam away from the arrangement.

In accordance with this invention, an inductor having an inductance is electrically connected to the transducer which has an inherent capacitance to form a resonant circuit having an electrical resonant frequency. As in the prior art, both the inductance and the capacitance vary with temperature, ageing, and in tolerance values from one inductor to the next, and from one transducer to the next, thereby causing the electrical resonant frequency to vary over a wide range, e.g., on the order of 12%.

However, in contrast with the prior art, the electrical resonant frequency is decoupled or unlinked from the mechanical resonant frequency. This is achieved by making the electrical resonant frequency greater than the mechanical resonant frequency. For example, if the mechanical resonant frequency is on the order of 30 kHz, then the values of inductance and capacitance are selected to make the electrical resonant frequency on the order of 80 kHz. This difference in frequency holds valid throughout the expected temperature, ageing and tolerance variations.

The transducer is driven with a drive signal having a drive frequency. The resonant circuit is driven not at the electrical resonance frequency as taught by the art, but instead, at the mechanical resonant frequency which, as noted above, differs in frequency from the electrical resonance frequency by a parameter. It is this parameter that is adjusted, rather than the drive frequency itself, in order to achieve correspondence between the mechanical resonance frequency and the drive frequency. Thus, the electrical resonance frequency is allowed to vary over the aforementioned wide (12%) range, but the drive frequency is precisely tuned to the mechanical resonance frequency and only allowed to vary over a limited (less than 1%) range. The drive frequency, now precisely tuned to the mechanical resonance frequency, is used to oscillate the mirror with the high precision and high scan rate required for image projection arrangements to project images of high resolution.

In the preferred embodiment, a bridge circuit having two arms is connected across a supply of DC voltage. Each arm has a pair of actuatable switches with a junction therebetween. A series resonant circuit consisting of the inductance of the inductor and the capacitance of the transducer is connected between the junctions of the arms. The switches are cyclically actuated, that is, opened or closed, by a controller, preferably a microprocessor, to convert the DC voltage to the drive voltage which has an alternating current waveform having a positive half cycle and a negative half cycle.

The actuation of at least one of the switches starts a time duration during which an electrical current flows in one direction through the inductor and an electrical charge is built up on the transducer. When the time duration ends, at least another one of the switches is actuated to cause the electrical current to flow in an opposite direction through the inductor and the electrical charge to continue to be built up on the transducer.

Stated differently, the electrical resonant cycle is periodically interrupted, and an electrical charge is stored on the capacitor during the electrical resonant cycle. This action decreases the drive frequency until it matches the mechanical resonant frequency, or, more precisely, until the fundamental of the drive frequency matches the mechanical resonant frequency.

Thus, the wavelength of the positive half cycle of the drive frequency closely matches the wavelength of the positive half cycle of the mechanical resonant frequency, but differs from the wavelength of the positive half cycle of the electrical resonant frequency by said time duration. The same is true for the negative half cycle of the drive frequency. Hence, stated algebraically:

$$(1/F_E)+2t_d=(1/F_M)=(1/F_D)$$

where $F_E$ is the electrical resonance frequency, where $F_M$ is the mechanical resonance frequency, where $F_D$ is the drive frequency, and where $t_d$ is the time duration, i.e., the parameter to be adjusted in order to achieve correspondence between the drive frequency and the mechanical resonance frequency.

In order to determine the mechanical resonance frequency and, hence, the initial value of the time duration, a feedback circuit is used to monitor the oscillating movement of the mirror and to generate a feedback signal. For example, a magnet can be mounted for joint movement on the mirror, and an adjacent electromagnetic coil magnetically interacts with the permanent magnetic field of the magnet to generate the feedback signal indicative of the position of the mirror. The feedback signal is processed to obtain its magnitude and its phase. When the magnitude is at a maximum, and when the phase is zero (thereby indicating a change in direction), the mechanical resonance frequency is determined.

In order to adjust the time duration, the microprocessor continuously monitors the magnitude and the phase of the feedback signal and dynamically adjusts the magnitude and the phase until the drive frequency matches the mechanical resonance frequency.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 1 is a perspective view of a hand-held instrument projecting an image at a working distance therefrom;

FIG. 2 is an enlarged, overhead, perspective view of an image projection arrangement utilizing this invention for installation in the instrument of FIG. 1;

DETAILED DESCRIPTION OF THE PREFERRED EMBODIMENTS

Figure 3:
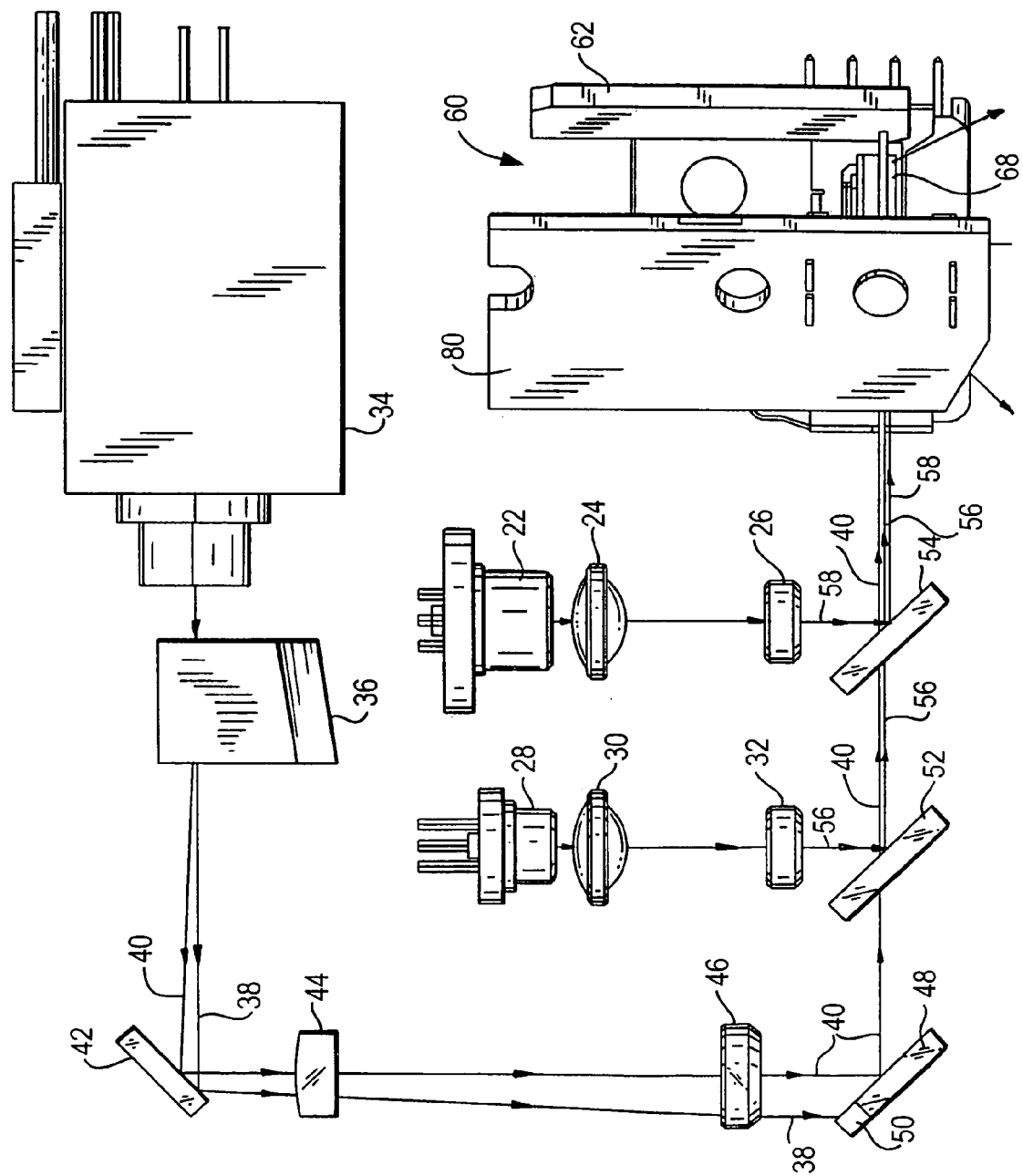
FIG. 3 is a top plan view of the arrangement of FIG. 2.

Reference numeral 10 in FIG. 1 generally identifies a hand-held instrument, for example, a personal digital assistant, in which a lightweight, compact, image projection arrangement 20, as shown in FIG. 2, is mounted and operative for projecting a two-dimensional color image at a variable distance from the instrument. By way of example, an image 18 is situated within a working range of distances relative to the instrument 10.

As shown in FIG. 1, the image 18 extends over an optical horizontal scan angle A extending along the horizontal direction, and over an optical vertical scan angle B extending along the vertical direction, of the image. As described below, the image is comprised of illuminated and non-illuminated pixels on a raster pattern of scan lines swept by a scanner in the arrangement 20.

The parallelepiped shape of the instrument 10 represents just one form factor of a housing in which the arrangement 20 may be implemented. The instrument can be shaped as a pen, a cellular telephone, a clamshell or a wristwatch, as, for example, shown in U.S. Pat. No. 6,832,724.

In the preferred embodiment, the arrangement 20 measures less than about 30 cubic centimeters in volume. This compact, miniature size allows the arrangement 20 to be mounted in housings of many diverse shapes, large or small, portable or stationary, including some having an on-board display 12, a keypad 14, and a window 16 through which the image is projected.

Referring to FIGS. 2 and 3, the arrangement 20 includes a semiconductor laser 22 which, when energized, emits a bright red laser beam at about 635–655 nanometers. Lens 24 is a biaspheric convex lens having a positive focal length and is operative for collecting virtually all the energy in the red beam and for producing a diffraction-limited beam. Lens 26 is a concave lens having a negative focal length. Lenses 24, 26 are held by non-illustrated respective lens holders apart on a support (not illustrated in FIG. 2 for clarity) inside the instrument 10. The lenses 24, 26 shape the red beam profile over the working distance.

Another semiconductor laser 28 is mounted on the support and, when energized, emits a diffraction-limited blue laser beam at about 475–505 nanometers. Another biaspheric convex lens 30 and a concave lens 32 are employed to shape the blue beam profile in a manner analogous to lenses 24, 26.

A green laser beam having a wavelength on the order of 530 nanometers is generated not by a semiconductor laser, but instead by a green module 34 having an infrared diode-pumped YAG crystal laser whose output beam is 1060 nanometers. A non-linear frequency doubling crystal is included in the infrared laser cavity between the two laser mirrors. Since the infrared laser power inside the cavity is much larger than the power coupled outside the cavity, the frequency doubler is more efficient generating the double frequency green light inside the cavity. The output mirror of the laser is reflective to the 1060 nm infrared radiation, and transmissive to the doubled 530 nm green laser beam. Since the correct operation of the solid-state laser and frequency doubler require precise temperature control, a semiconductor device relying on the Peltier effect is used to control the temperature of the green laser module. The thermo-electric cooler can either heat or cool the device depending on the polarity of the applied current. A thermistor is part of the green laser module in order to monitor its temperature. The readout from the thermistor is fed to the controller, which adjusts the control current to the thermo-electric cooler accordingly.

As explained below, the lasers are pulsed in operation at frequencies on the order of 100 MHz. The red and blue semiconductor lasers 22, 28 can be pulsed at such high frequencies, but the currently available green solid-state lasers cannot. As a result, the green laser beam exiting the green module 34 is pulsed with an acousto-optical modulator (AOM) 36 which creates an acoustic standing wave inside a crystal for diffracting the green beam. The AOM 36, however, produces a zero-order, non-diffracted beam 38 and a first-order, pulsed, diffracted beam 40. The beams 38, 40 diverge from each other and, in order to separate them to eliminate the undesirable zero-order beam 38, the beams 38, 40 are routed along a long, folded path having a folding mirror 42. Alternatively, the AOM can be used either externally or internally to the green laser module to pulse the green laser beam. Other possible ways to modulate the green laser beam include electro-absorption modulation, or Mach-Zender interferometer. The AOM is shown schematically in FIG. 2.

The beams 38, 40 are routed through positive and negative lenses 44, 46. However, only the diffracted green beam 40 is allowed to impinge upon, and reflect from, the folding mirror 48. The non-diffracted beam 38 is absorbed by an absorber 50, preferably mounted on the mirror 48.

The arrangement includes a pair of dichroic filters 52, 54 arranged to make the green, blue and red beams as co-linear as possible before reaching a scanning assembly 60. Filter 52 allows the green beam 40 to pass therethrough, but the blue beam 56 from the blue laser 28 is reflected by the interference effect. Filter 54 allows the green and blue beams 40, 56 to pass therethrough, but the red beam 58 from the red laser 22 is reflected by the interference effect.

Figure 4:
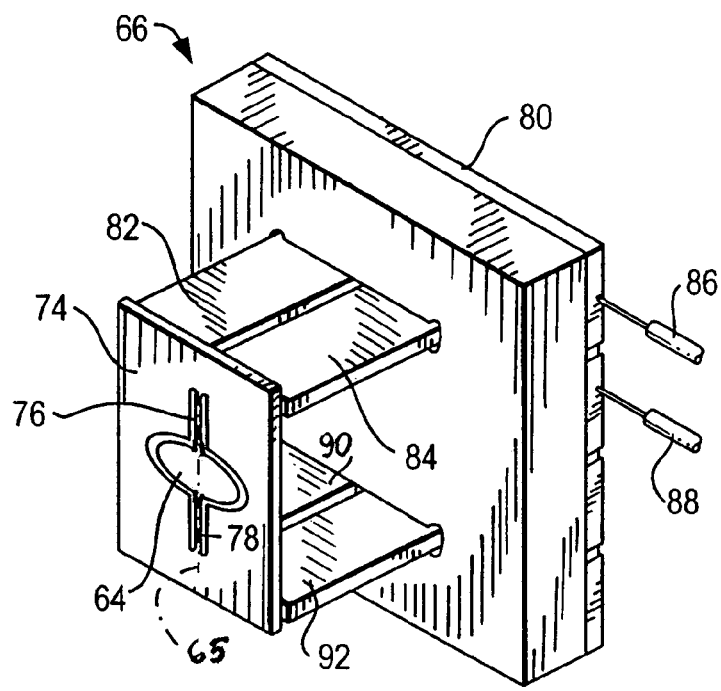
FIG. 4 is a perspective front view of an inertial drive for use in the arrangement of FIG. 2.
Figure 5:
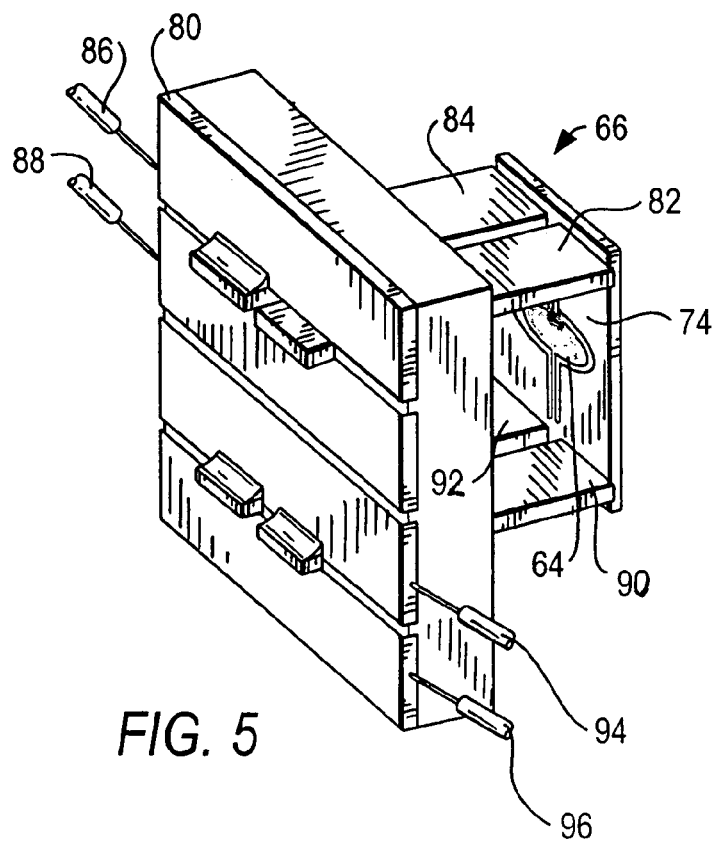
FIG. 5 is a perspective rear view of the inertial drive of FIG. 4.

The nearly co-linear beams 40, 56, 58 are directed to, and reflected off, a stationary bounce mirror 62. The scanning assembly 60 includes a first scan mirror 64 oscillatable by an inertial drive 66 (shown in isolation in FIGS. 4–5) at a first scan rate to sweep the laser beams reflected off the bounce mirror 62 over the first horizontal scan angle A, and a second scan mirror 68 oscillatable by an electromagnetic drive 70 at a second scan rate to sweep the laser beams reflected off the first scan mirror 64 over the second vertical scan angle B. In a variant construction, the scan mirrors 64, 68 can be replaced by a single two-axis mirror.

The inertial drive 66 is a high-speed, low electrical power-consuming component. Details of the inertial drive can be found in U.S. patent application Ser. No. 10/975,888, filed Oct. 27, 2004, and U.S. patent application Ser. No. 10/387,878, filed Mar. 13, 2003, both assigned to the same assignee as the instant application, and both incorporated herein by reference thereto. The use of the inertial drive reduces power consumption of the scanning assembly 60 to less than one watt and, in the case of projecting a color image, as described below, to less than ten watts.

The drive 66 includes a movable frame 74 for supporting the scan mirror 64 by means of a hinge that includes a pair of co-linear hinge portions 76, 78 extending along a hinge axis 65 and connected between opposite regions of the scan mirror 64 and opposite regions of the frame. The frame 74 need not surround the scan mirror 64, as shown.

The frame, hinge portions and scan mirror are fabricated of a one-piece, generally planar, silicon substrate which is approximately 150μ thick. The silicon is etched to form omega-shaped slots having upper parallel slot sections, lower parallel slot sections, and U-shaped central slot sections. The scan mirror 64 preferably has an oval shape and is free to move in the slot sections. In the preferred embodiment, the dimensions along the axes of the oval-shaped scan mirror measure 749μ×1600μ. Each hinge portion measure 27μ in width and 1130μ in length. The frame has a rectangular shape measuring 3100μ in width and 4600μ in length.

The inertial drive is mounted on a generally planar, printed circuit board 80 and is operative for directly moving the frame and, by inertia, for indirectly oscillating the scan mirror 64 about the hinge axis. One embodiment of the inertial drive includes a pair of piezoelectric transducers 82, 84 extending perpendicularly of the board 80 and into contact with spaced apart portions of the frame 74 at either side of hinge portion 76. An adhesive may be used to insure a permanent contact between one end of each transducer and each frame portion. The opposite end of each transducer projects out of the rear of the board 80 and is electrically connected by wires 86, 88 to a periodic drive signal generated by a drive circuit, as described below in connection with FIGS. 8–11, which constitutes the instant invention.

In use, the drive circuit applies a periodic drive voltage signal to each transducer and causes the respective transducer to alternatingly extend and contract in length. When transducer 82 extends, transducer 84 contracts, and vice versa, thereby simultaneously pushing and pulling the spaced apart frame portions and causing the frame to twist about the hinge axis. The drive voltage signal has a drive frequency corresponding to the mechanical resonant frequency of the scan mirror. The scan mirror is moved from its initial rest position until it also oscillates about the hinge axis at the mechanical resonant frequency. In a preferred embodiment, the frame and the scan mirror are about 150µ thick, and the scan mirror has a high Q factor. A movement on the order of 1µ by each transducer can cause oscillation of the scan mirror at scan rates in excess of 20 kHz, and can cause a light beam incident on the scan mirror to be swept through a 30° arc.

Another pair of piezoelectric transducers 90, 92 extends perpendicularly of the board 80 and into permanent contact with spaced apart portions of the frame 74 at either side of hinge portion 78. Transducers 90, 92 serve as feedback devices to monitor the oscillating movement of the frame and, hence, of the scan mirror 64, and to generate and conduct electrical feedback signals along wires 94, 96 to a feedback control circuit described below in connection with FIG. 11.

Alternately, instead of using piezoelectric transducers 90, 92 for feedback, magnetic feedback can be used, where a permanent magnet is mounted on the back of the high-speed mirror, and an external electromagnetic coil is used to pickup the changing magnetic field generated by the oscillating magnet.

Although light can reflect off an outer surface of the scan mirror, it is desirable to coat the surface of the mirror 64 with a specular coating made of gold, silver, aluminum, or a specially designed highly reflective dielectric coating.

The electromagnetic drive 70 includes a permanent magnet jointly mounted on and behind the second scan mirror 68, and an electromagnetic coil 72 operative for generating a periodic magnetic field in response to receiving a periodic drive signal. The coil 72 is adjacent the magnet so that the periodic field magnetically interacts with the permanent field of the magnet and causes the magnet and, in turn, the second scan mirror 68 to oscillate.

The inertial drive 66 oscillates the scan mirror 64 at a high speed at a scan rate preferably greater than 5 kHz and, more particularly, on the order of 18 kHz or more. This high scan rate is at an inaudible frequency, thereby minimizing noise and vibration. The electromagnetic drive 70 oscillates the scan mirror 68 at a slower scan rate on the order of 40 Hz which is fast enough to allow the image to persist on a human eye retina without excessive flicker.

The faster mirror 64 sweeps a horizontal scan line, and the slower mirror 68 sweeps the horizontal scan line vertically, thereby creating a raster pattern which is a grid or sequence of roughly parallel scan lines from which the image is constructed. Each scan line has a number of pixels. The image resolution is preferably XGA quality of 1024×768 pixels. Over a limited working range we can display high-definition television standard, denoted 720p, 1270×720 pixels. In some applications, a one-half VGA quality of 320×480 pixels, or one-fourth VGA quality of 320×240 pixels, is sufficient. At minimum, a resolution of 160×160 pixels is desired.

The roles of the mirrors 64, 68 could be reversed so that mirror 68 is the faster, and mirror 64 is the slower. Mirror 64 can also be designed to sweep the vertical scan line, in which event, mirror 68 would sweep the horizontal scan line. Also, the inertial drive can be used to drive the mirror 68. Indeed, either mirror can be driven by an electromechanical, electrical, mechanical, electrostatic, magnetic, or electromagnetic drive.

The slow-mirror is operated in a constant velocity sweep-mode during which time the image is displayed. During the mirror's return, the mirror is swept back into the initial position at its natural frequency, which is significantly higher. During the mirror's return trip, the lasers can be powered down in order to reduce the power consumption of the device.

Figure 6:
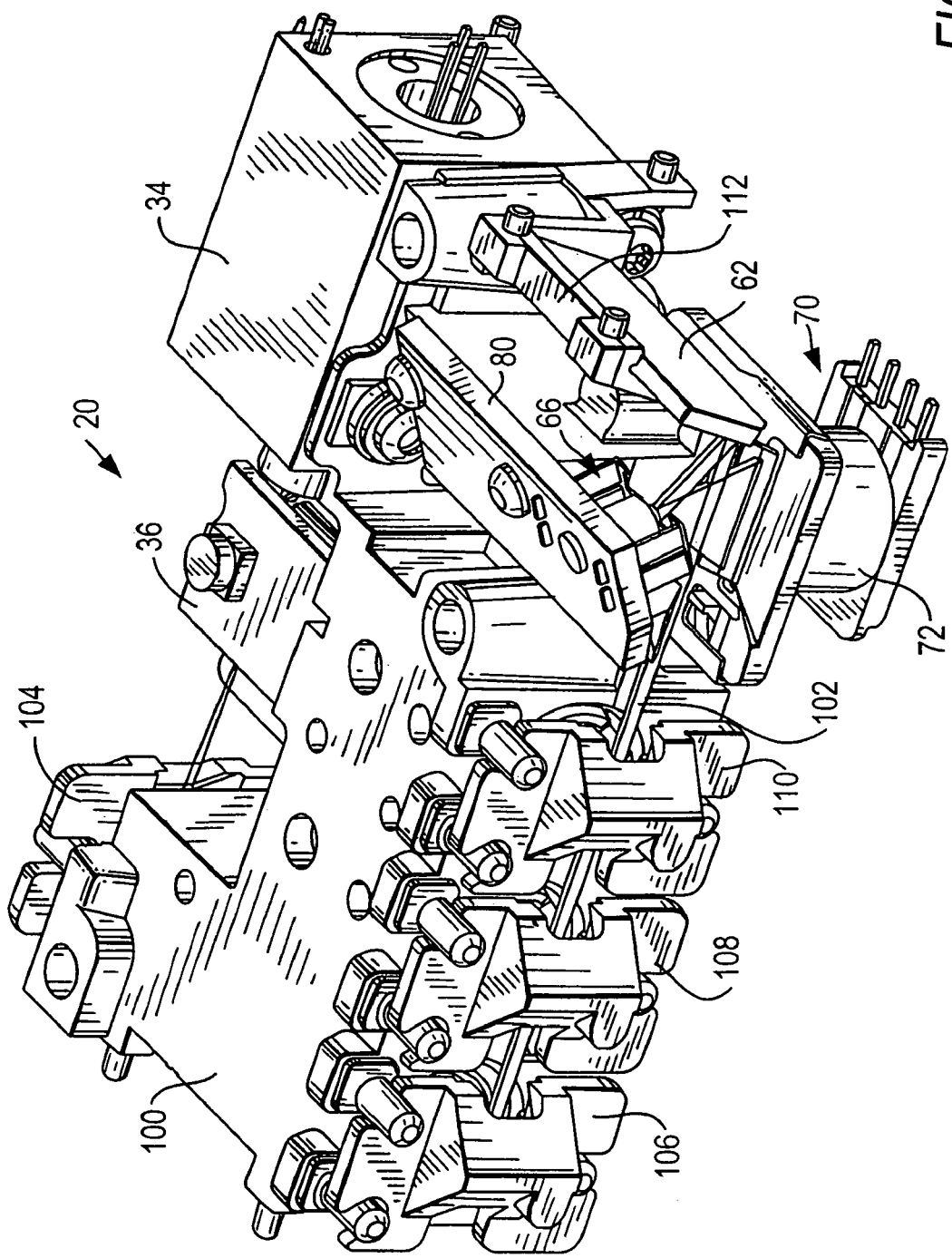
FIG. 6 is a perspective view of a practical implementation of the arrangement of FIG. 2.

FIG. 6 is a practical implementation of the arrangement 20 in the same perspective as that of FIG. 2. The aforementioned components are mounted on a support which includes a top cover 100 and a support plate 102. Holders 104, 106, 108, 110, 112 respectively hold folding mirrors 42, 48, filters 52, 54 and bounce mirror 62 in mutual alignment. Each holder has a plurality of positioning slots for receiving positioning posts stationarily mounted on the support. Thus, the mirrors and filters are correctly positioned. As shown, there are three posts, thereby permitting two angular adjustments and one lateral adjustment. Each holder can be glued in its final position.

The image is constructed by selective illumination of the pixels in one or more of the scan lines. As described below in greater detail with reference to FIG. 7, a controller 114 causes selected pixels in the raster pattern to be illuminated, and rendered visible, by the three laser beams. For example, red, blue and green power controllers 116, 118, 120 respectively conduct electrical currents to the red, blue and green lasers 22, 28, 34 to energize the latter to emit respective light beams at each selected pixel, and do not conduct electrical currents to the red, blue and green lasers to de-energized the latter to non-illuminate the other non-selected pixels. The resulting pattern of illuminated and non-illuminated pixels comprise the image, which can be any display of human- or machine-readable information or graphic.

Referring to FIG. 1, the raster pattern is shown in an enlarged view. Starting at an end point, the laser beams are swept by the inertial drive along the horizontal direction at the horizontal scan rate to an opposite end point to form a scan line. Thereupon, the laser beams are swept by the electromagnetic drive 70 along the vertical direction at the vertical scan rate to another end point to form a second scan line. The formation of successive scan lines proceeds in the same manner.

The image is created in the raster pattern by energizing or pulsing the lasers on and off at selected times under control of the microprocessor 114 or control circuit by operation of the power controllers 116, 118, 120. The lasers produce visible light and are turned on only when a pixel in the desired image is desired to be seen. The color of each pixel is determined by one or more of the colors of the beams. Any color in the visible light spectrum can be formed by the selective superimposition of one or more of the red, blue, and green lasers. The raster pattern is a grid made of multiple pixels on each line, and of multiple lines. The image is a bit-map of selected pixels. Every letter or number, any graphical design or logo, and even machine-readable bar code symbols, can be formed as a bit-mapped image.

Figure 7:
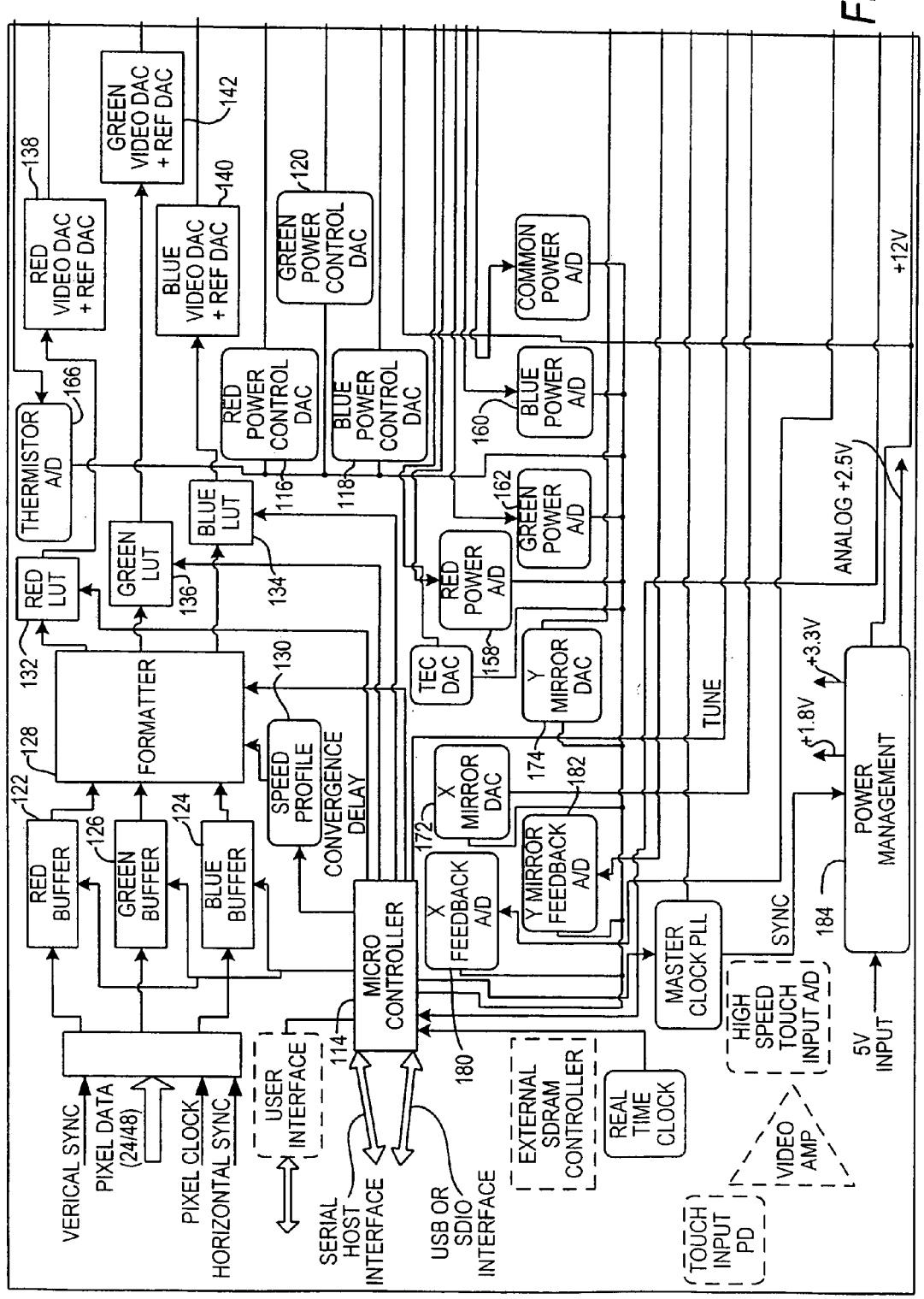
FIG. 7 and FIG. 7A together are is an electrical schematic block diagram depicting operation of the arrangement of FIG. 2.
Figure 7A:
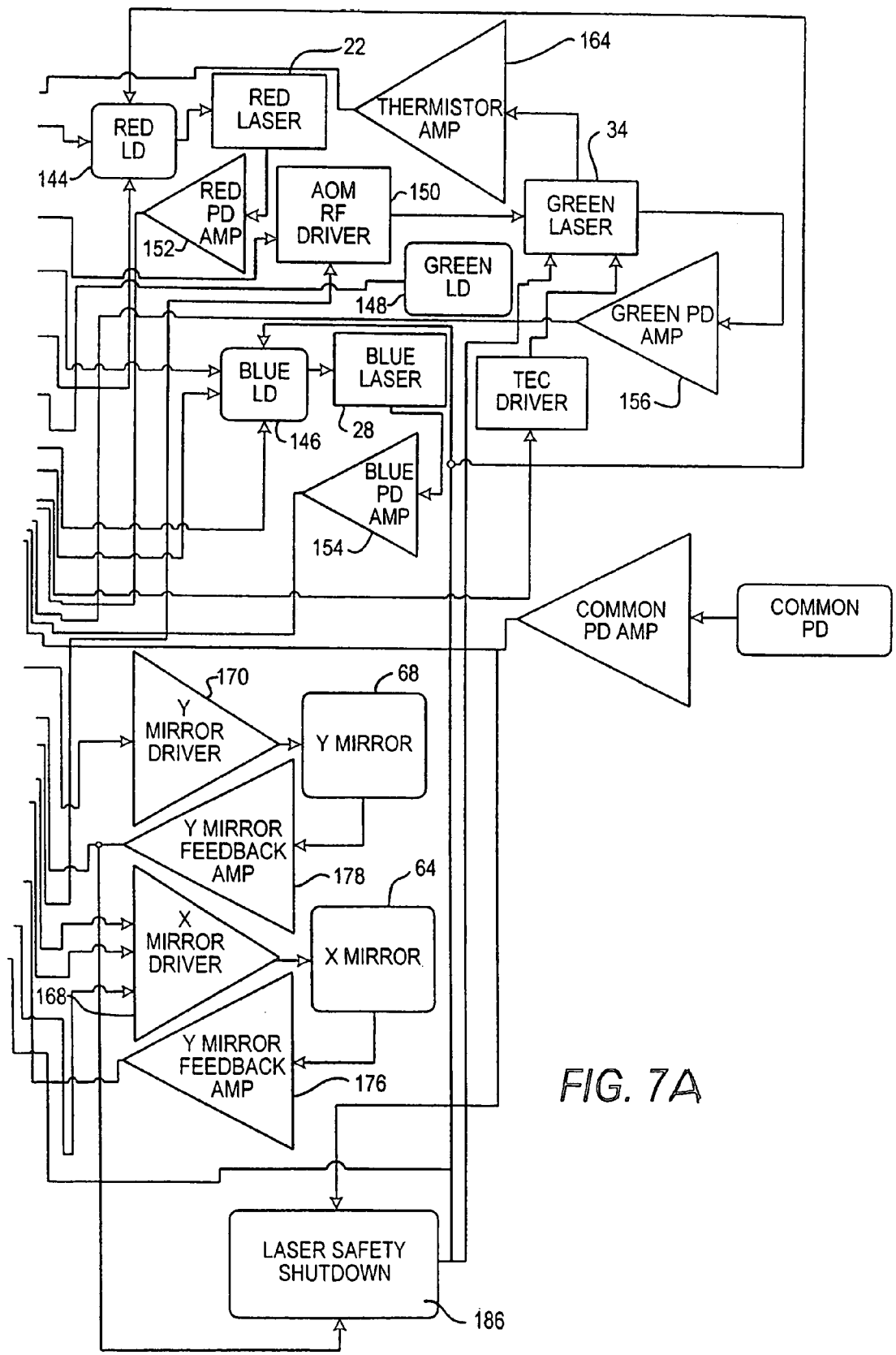

As shown in FIG. 7 and 7A, an incoming video signal having vertical and horizontal synchronization data, as well as pixel and clock data, is sent to red, blue and green buffers 122, 124, 126 under control of the microprocessor 114. The storage of one full VGA frame requires many kilobytes, and it would be desirable to have enough memory in the buffers for two full frames to enable one frame to be written, while another frame is being processed and projected. The buffered data is sent to a formatter 128 under control of a speed profiler 130 and to red, blue and green look up tables (LUTs) 132, 134, 136 to correct inherent internal distortions caused by. scanning, as well as geometrical distortions caused by the angle of the display of the projected image. The resulting red, blue and green digital signals are converted to red, blue and green analog signals by digital to analog converters (DACs) 138, 140, 142. The red and blue analog signals are fed to red and blue laser drivers (LDs) 144, 146 which are also connected to the red and blue power controllers 116, 118. The green analog signal is fed to the AOM radio frequency (RF) driver 150 and, in turn, to the green laser 34 which is also connected to a green LD 148 and to the green power controller 120.

Feedback controls are also shown in FIG. 7 and FIG. 7A, including red, blue and green photodiode amplifiers 152, 154, 156 connected to red, blue and green analog-to-digital (A/D) converters 158, 160, 162 and, in turn, to the microprocessor 114. Heat is monitored by a thermistor amplifier 164 connected to an A/D converter 166 and, in turn, to the microprocessor.

The scan mirrors 64, 68 are driven by drivers 168, 170 which are fed analog drive signals from DACs 172, 174 which are, in turn, connected to the microprocessor. Feedback amplifiers 176, 178 detect the position of the scan mirrors 64, 68, and are connected to feedback A/Ds 180, 182 and, in turn, to the microprocessor.

A power management circuit 184 is operative to minimize power while allowing fast on-times, preferably by keeping the green laser on all the time, and by keeping the current of the red and blue lasers just below the lasing threshold.

A laser safety shut down circuit 186 is operative to shut the lasers off if either of the scan mirrors 64, 68 is detected as being out of position.

Figure 8:
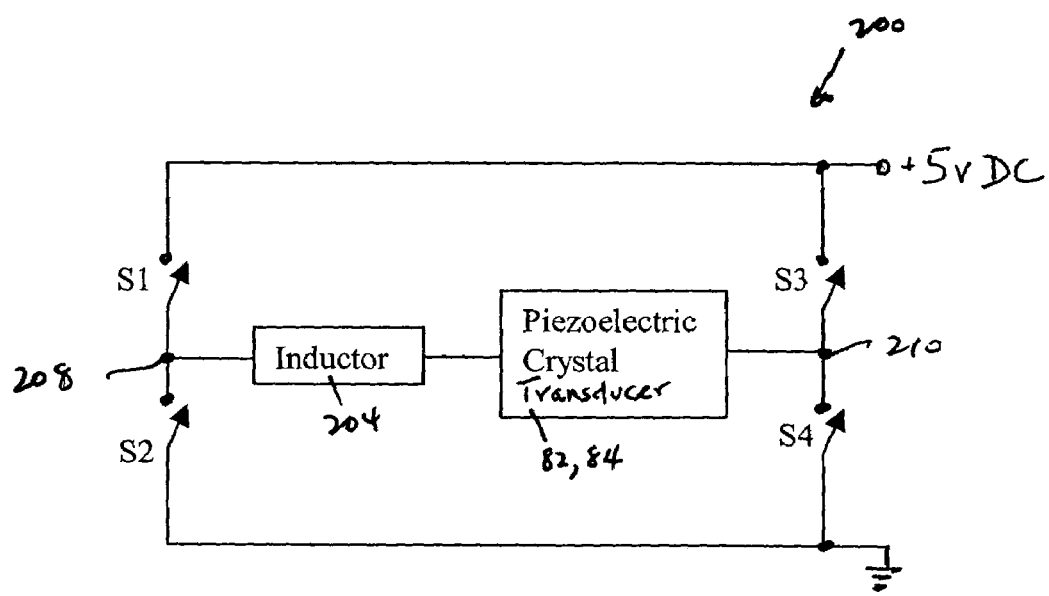
FIG. 8 is a schematic diagram of a drive circuit for the inertial drive of FIGS. 4–5.
Figure 9:
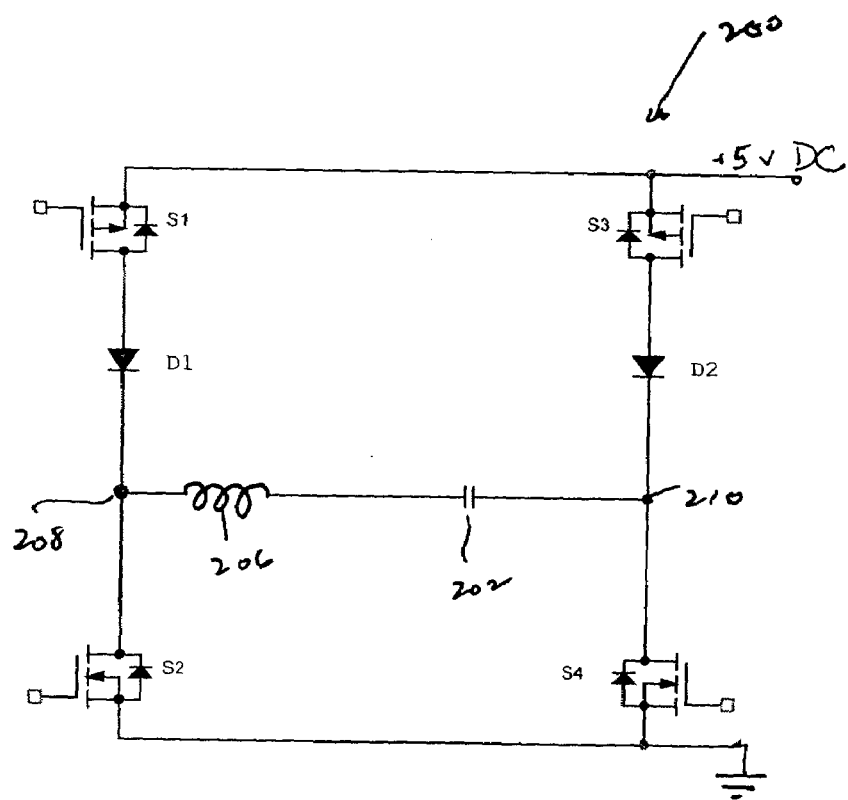
FIG. 9 is a practical implementation of the drive circuit of FIG. 8.

As mentioned above, each piezoelectric transducer 82, 84 is driven by a periodic drive signal generated by a drive circuit 200 shown schematically in FIG. 8 and in a practical implementation in FIG. 9. Each piezoelectric transducer or crystal has an inherent capacitance 202. An inductor 204 having an inductance 206 is connected in series with the capacitance 202 to form a series resonant circuit having an electrical resonant frequency ($F_E$).

As explained above, ideally, the drive signal has a drive frequency ($F_D$) which is matched to the mechanical resonant frequency ($F_M$) of the scan mirror 64 of the inertial drive 66, also called a piezoelectric motor. To achieve a voltage boost or multiplication from low to high voltages for greater efficiency, the resonant circuit must be driven at the electrical resonant frequency. However, ageing of the inductor and the transducer, tolerance variations from one of these components to another, and ambient temperature changes, all contribute to wide variation, e.g., on the order of 12%, of the electrical resonant frequency. This variation of the electrical resonant frequency degrades the efficiency of the drive circuit and, in the context of an image projection arrangement, degrades the resolution of the projected image.

In accordance with this invention, the resonant circuit is not driven at the electrical resonant frequency, but at the mechanical resonant frequency. The electrical and mechanical resonant frequencies are decoupled or unlinked from each other, and a parameter defining a difference between the electrical resonant frequency and the drive frequency is adjusted, as explained in detail below. The electrical resonance frequency is allowed to vary over its wide range.

As shown in FIG. 8, a bridge is established across a low voltage direct current power supply, e.g., 5 volts DC, and ground. One arm of the bridge has two actuatable switches S1 and S2 connected together at a junction 208. Another arm of the bridge has two more actuatable switches S3 and S4 connected together at another junction 210. The series resonant circuit is connected between the junctions 208, 210.

As shown in FIG. 9, each switch is preferably a MosFET transistor. Switches S1, S3 are preferably p-channel; switches S2, S4 are preferably n-channel. Other types of switches, such as bipolar transistors or optically isolated switches, could also be used. Diodes D1, D2 are respectively connected in series with the drains of S1, S3.

In one embodiment, S1 and S4 are simultaneously closed (while S2 and S3 are opened) to apply the DC voltage in a positive sense across the series resonant circuit, and then S2 and S3 are simultaneously closed (while S1 and S4 are opened) to apply the DC voltage in a negative sense across the series resonant circuit. Voltage multiplication of the low DC voltage (5 volts) to a high AC voltage (50 volts peak-to-peak) in the resonant circuit is a function of the Q value of the resonant circuit. The Q value is inversely proportional to the resistive losses therein. A Q value in a range of 10–100 is readily achievable.

Figure 10:
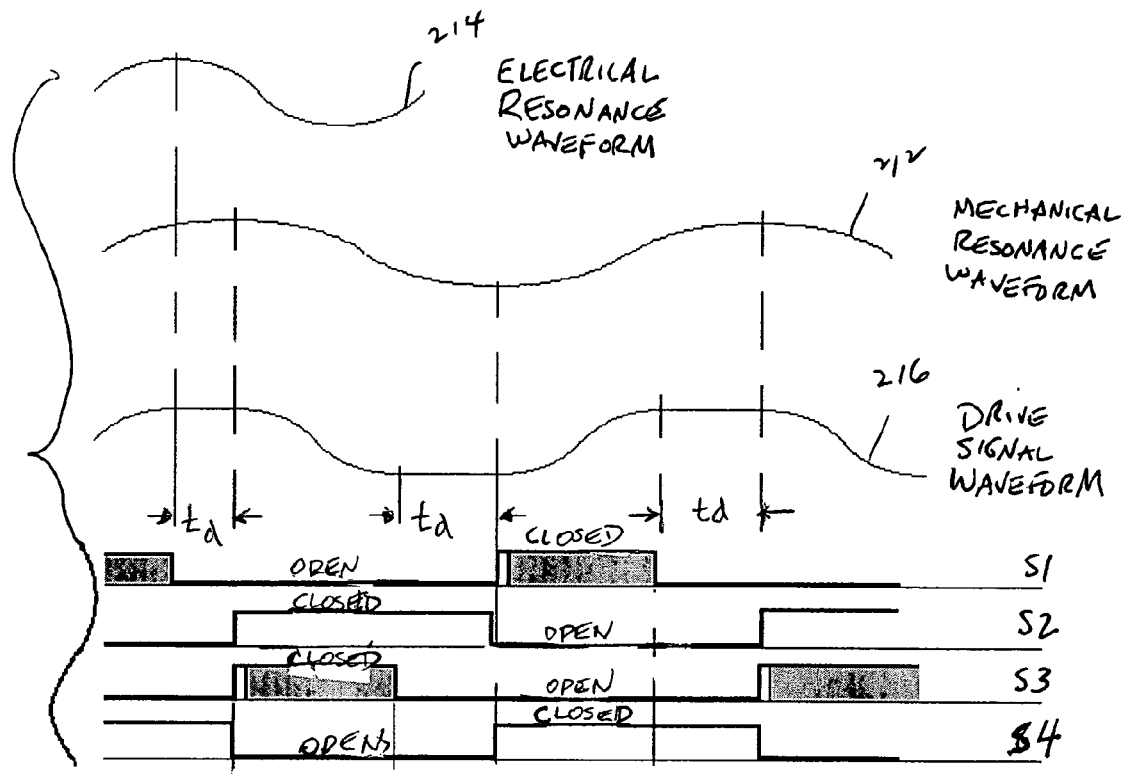
FIG. 10 is a series of waveforms to explain the operation of the drive circuit FIG. 8.

In accordance with this invention, the electrical resonance frequency is chosen to be always higher than the mechanical resonance frequency. Referring now to FIG. 10, reference numeral 212 depicts the mechanical resonance waveform, and reference numeral 214 depicts the electrical resonance waveform. It will be observed that the electrical resonant frequency $F_E$ is less than the mechanical resonant frequency $F_M$. By way of numerical example, $F_M$ is typically about 30 kHz and lies in a range from 29 kHz–31.5 kHz. The capacitance 202 is typically about 4 nanofarads, and the value of the inductance 206 is selected to be about 1 millihenry so that $F_E$ is typically about 80 kHz. The difference between 30 kHz and 80 kHz represents the frequency decoupling mentioned above.

The opening and the closing of the switches S1, S2, S3, S4, as illustrated in FIG. 10, generates the periodic drive signal (for driving the piezoelectric transducer) whose waveform is identified in FIG. 10 by the reference numeral 216. The periodic drive signal is generated by the circuit of FIG. 9 as follows. Initially, there is zero current in the inductor 204 and zero charge on the capacitor 82, 84. Switches S1 and S4 are closed, while switches S2, S3 are opened, thereby connecting the series resonant circuit across the power supply. Current starts increasing through the inductor, and an electrical charge starts to build up on the capacitor. It will be appreciated that as long as S1 and S4 are closed, the amplitude of the drive signal (that is, the voltage on the capacitor) increases with a sinusoidal component that has a frequency equal to the electrical resonance frequency of the inductor and the capacitor. This is an amplitude control feature, because the longer that switch S1 is closed, as represented by shading in FIG. 10, the greater the drive signal amplitude, and vice versa. At the time that the inductor current equals zero, the peak charge and, therefore, the peak voltage is on the capacitor. This peak voltage may exceed the +5 volts DC and would begin to discharge through a reversed flow of current through S1, S4, the inductor and the capacitor. However, the reversed current flow is blocked by the now reverse biased diode D1. Thus, the peak charge is trapped on the capacitor. If an ideal switch was used for S1, then it would be opened at this time in order to trap the peak charge on the capacitor.

After a time period equal to $t_d$ (whose determination is described below), switch S4 is opened, and switches S2, S3 are simultaneously closed. Switch S1 is already open. Now, the current through the inductor flows in the opposite direction with a reversed sinusoidal component; however, the charge that was trapped on the capacitor supplies an electromotive force that is superimposed on the +5 volts DC power supply, so that the resulting current and voltage amplitudes are larger than before. The effectively larger voltage source increases the current and voltage levels in the resonant circuit resulting in an increase in the charge that becomes trapped across the capacitor, only now in reverse potential by the action of diode D2.

After another time period equal to $t_d$, the cycle repeats and continues to build charge on the capacitor, every half cycle, until the resonant circuit losses plus the mechanical losses balance the energy introduced during a switch closure. It should be noted that the energy introduced during switch closure is dependent upon switch closure time. For example, by prematurely opening switches S1 and S3, the energy introduced during a cycle may be reduced. The resulting capacitor voltage is reduced by the energy balance of losses in the cycle. Therefore, switch timing may also be used to control the drive signal amplitude. This method of controlling switch opening times and therefore drive voltage is indicated in FIG. 10 by shading of the S1 and S3 closure times. The resulting capacitor voltage (drive signal) waveform 216 resembles the mechanical resonance waveform 212, except that its fundamental wavelength is longer. The relationship among the waveforms of FIG. 10 can be algebraically expressed as follows:

$$(1/F_E) + 2t_d = (1/F_M) = (1/F_D)$$

Thus, the drive frequency can be made to correspond to the mechanical resonant frequency by adjusting the time period $t_d$. This time period is the aforementioned parameter to be adjusted.

The time period $t_d$ can be determined by measuring the piezoelectric motor response to the drive signal. This time period can be adjusted to maximize the amplitude response of the motor, or based on the phase response.

Figure 11:
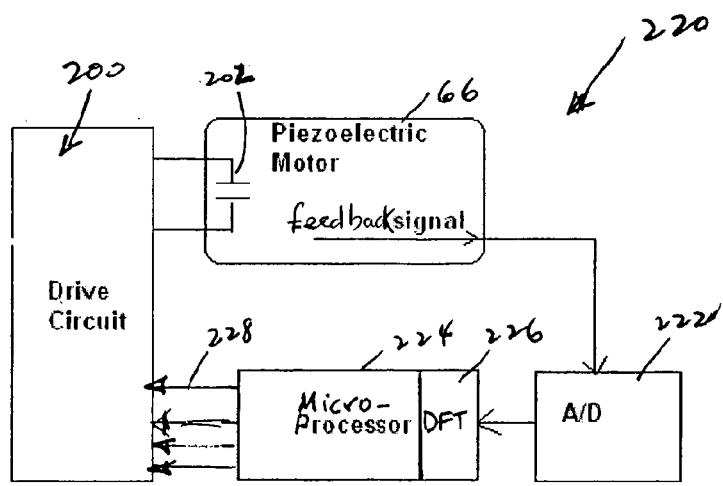
FIG. 11 is a schematic diagram of a control circuit for controlling operation of the drive circuit of FIG. 8.

More specifically, as shown in FIG. 11, a feedback control circuit 220 is employed for adjusting the time period $t_d$. The aforementioned feedback transducers 90, 92 of the piezoelectric motor 66 generate a feedback signal indicative of the oscillation movement of the scan mirror 64. The feedback signal has a magnitude indicating the angular extent of the displacement of the mirror, and a phase indicating the direction of the mirror.

The analog feedback signal is converted to a digital feedback signal by an analog-to-digital (A/D) converter 222. This digital signal is sampled by a controller, preferably a microprocessor 224, which performs a discrete Fourier transform (DFT) calculation 226 which transforms the sampled signal in the time domain to a sampled signal in the frequency domain. In the frequency domain, the magnitude and phase of the oscillating motion of the mirror are evident. Since the mechanical oscillations of the mirror can be modeled as a resonant device with a relatively high Q, the magnitude response and phase response vary greatly with the drive stimulus frequency. In this way, the response of the piezoelectric motor to the drive signal is monitored. When the magnitude is a maximum value, and when the phase shift is zero, this indicates that the mirror is at mechanical resonance. If the monitored magnitude and the phase differ from these conditions, then the microprocessor will change the value of $t_d$ until the mechanical resonance condition is achieved.

The microprocessor 224 has four control outputs 228 which are respectively connected to the control inputs of the switches S1, S2, S3, S4 to control their opening and closing.

It will be understood that each of the elements described above, or two or more together, also may find a useful application in other types of constructions differing from the types described above.

While the invention has been illustrated and described as embodied in an arrangement for and a method of electrically driving a piezoelectric transducer, especially for use in a color image projection arrangement and method, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

We claim:

1. An arrangement for electrically driving a piezoelectric transducer to mechanically oscillate a mirror at a mechanical resonant frequency in opposite circumferential directions about an axis, comprising:
   a) an inductor having an inductance electrically connected to the transducer having an inherent capacitance to form a series resonant circuit having an electrical resonant frequency which is greater than the mechanical resonant frequency throughout variations in temperature, ageing and tolerances of the transducer and the inductor;
   b) means for driving the resonant circuit with an electrical drive signal having a drive frequency which differs from the electrical resonant frequency by a parameter, the driving means including a bridge circuit having two arms connected across a supply of DC voltage, each arm having a pair of actuatable switches and a junction therebetween, the series resonant circuit being connected between each junction of the arms; and
   c) means for adjusting the parameter to make the drive frequency correspond to the mechanical resonant frequency to oscillate the mirror at the same angular speed in both the circumferential directions and to compensate for said variations in the electrical resonant frequency, the adjusting means including a controller for cyclically controlling actuation of the switches, at least one of the switches being actuated at a different time than another of the switches, the different time being the parameter to be adjusted.

2. The arrangement of claim 1, wherein the electrical resonant frequency is more than two times greater than the mechanical resonant frequency.

3. The arrangement of claim 1, wherein each switch is a transistor, and wherein the bridge circuit includes a diode connected between one of the switches of each arm and the junction of the respective arm.

4. The arrangement of claim 1, wherein the controller is also operative for cyclically controlling actuation of the switches to convert the DC voltage to the drive voltage having an alternating current waveform having cycles.

5. The arrangement of claim 4, wherein the controller closes at least one of the switches in each arm and opens at-least another of the switches in each arm for a switching time period which determines said parameter to be adjusted.

6. The arrangement of claim 5, wherein the capacitance is charged during each half cycle of the drive voltage.

7. The arrangement of claim 4, wherein the controller closes at least one of the switches for a time interval that determines an amplitude of the drive signal.

8. A method of electrically driving a piezoelectric transducer to mechanic ally oscillate a mirror at a mechanical resonant frequency in opposite circumferential directions about an axis, comprising the steps of:
 a) electrically connecting an inductor having an inductance to the transducer having an inherent capacitance to form a series resonant circuit having an electrical resonant frequency which is greater than the mechanical resonant frequency throughout variations in temperature, ageing and tolerances of the transducer and the inductor;
 b) driving the resonant circuit with an electrical drive signal having a drive frequency which differs from the electrical resonant frequency by a parameter, the driving step including forming a bridge circuit having two arms connected across a supply of DC voltage, each arm having a pair of actuatable switches and a junction therebetween, and connecting the series resonant circuit between each junction of the arms; and
 c) adjusting the parameter to make the drive frequency correspond to the mechanical resonant frequency to oscillate the mirror at the same angular speed in both the circumferential directions and to compensate for said variations in the electrical resonant frequency by cyclically controlling actuation of the switches, at least one of the switches being actuated at a different time than another of the switches, the different time being the parameter to be adjusted.

9. The method of claim 8, wherein the electrical resonant frequency is more than two times greater than the mechanical resonant frequency.

10. The method of claim 8, wherein each switch is a transistor, and wherein the bridge circuit includes a diode connected between one of the switches of each arm and the junction of the respective arm.

11. The method of claim 8, wherein the step of cyclically controlling actuation of the switches also converts the DC voltage to the drive voltage having an alternating current waveform with cycles.

12. The method of claim 11, wherein the controlling step closes at least one of the switches in each arm and opens at least another of the switches in each arm for a switching time period which determines said parameter to be adjusted.

13. The method of claim 12, wherein the capacitance is charged during each half cycle of the drive voltage.

14. The method of claim 11, wherein the controlling step includes controlling an amplitude of the drive voltage by controlling a time interval during which one of the switches is closed.

* * * * *